United States Patent [19]

Hieber et al.

[11] Patent Number: 4,680,612

[45] Date of Patent: Jul. 14, 1987

[54] INTEGRATED SEMICONDUCTOR CIRCUIT INCLUDING A TANTALUM SILICIDE DIFFUSION BARRIER

[75] Inventors: Konrad Hieber, Bernau; Franz Neppl; Konrad Schober, both of Munich, all of Fed. Rep. of Germany

[73] Assignee: Siemens Aktiengesellschaft, Berlin and Munich, Fed. Rep. of Germany

[21] Appl. No.: 843,380

[22] Filed: Mar. 24, 1986

[30] Foreign Application Priority Data

Apr. 11, 1985 [DE] Fed. Rep. of Germany ....... 3513002

[51] Int. Cl.$^4$ ............................................. H01L 23/48
[52] U.S. Cl. ........................................ 357/71; 357/67; 428/620; 428/651; 428/662
[58] Field of Search .................. 357/67, 67 R, 67 S, 357/71; 428/620, 651, 662

[56] References Cited

U.S. PATENT DOCUMENTS

| 3,641,402 | 2/1972 | Revitz et al. | 357/67 |
| 3,717,563 | 2/1973 | Revitz et al. | 357/67 |
| 4,165,241 | 8/1979 | Yerkes et al. | 357/67 S |
| 4,179,533 | 12/1979 | Christon et al. | 357/71 |

FOREIGN PATENT DOCUMENTS

| 0132720 | 7/1984 | European Pat. Off. | 357/68 |
| 8601640 | 3/1986 | European Pat. Off. | 357/68 |
| 56-81953 | 7/1981 | Japan | 428/620 |

OTHER PUBLICATIONS

Garbarino et al., "Contact Barrier Metallurgy for Mosfet Gate", IBM Technical Disclosure Bulletin.
Thin Films Interdiffusion and Reactions, John Wiley and Sons, New York, 1978, p. 15–25.
Thin Solid Films, 96 (1982), p. 301–316.
Solid State Technol., Jun. 1983, p. 119–126.
J. Appl. Phys., 53 (1982), p. 6898–6905.
Solid State Technol., Apr. 1984, p. 313–314.
Thin Solid Films, 96 (1982), p. 327–345.
J. Vac. Sci. Technol. A2, 2 (1984), p. 273–279.
Thin Solid Films, 104 (1983), p. 81–87.
IEEE Transactions on Industrial Electronics, 29 (1982), p. 154–157.
Thin Solid Films, 107 (1983), p. 73–80.
J. Vac. Sci. Technol. A1, 2 (1983), p. 459–462.
J. Vac. Sci. Technol. 18 (1981), p. 345–348.

Primary Examiner—Martin H. Edlow
Assistant Examiner—Ngan Ngo
Attorney, Agent, or Firm—Hill, Van Santen, Steadman & Simpson

[57] ABSTRACT

An integrated semiconductor circuit consisting of a silicon substrate having an impurity doped circuit therein, and a layer of silicon dioxide formed on the substrate and having a contact hole therein overlying the circuit. An outer contact interconnect level composed of aluminum or an aluminum alloy provides electrical contact to the circuit. A tantalum disilicide diffusion barrier layer is disposed between the circuit and the interconnect level, with a layer of substantially pure tantalum both above and below the tantalum disilicide diffusion barrier layer.

10 Claims, 1 Drawing Figure

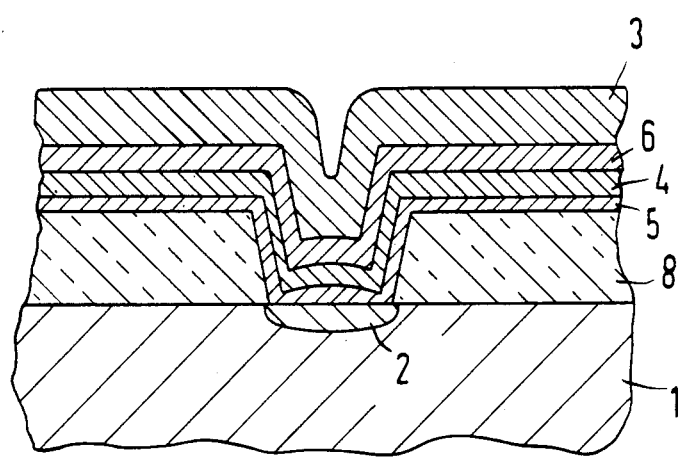

INTEGRATED SEMICONDUCTOR CIRCUIT INCLUDING A TANTALUM SILICIDE DIFFUSION BARRIER

BACKGROUND OF THE INVENTION

1. Field of the Invention

This invention is in the field of integrated semiconductor circuit elements wherein a diffusion barrier layer of tantalum disilicide covered on each side with a layer of substantially pure tantalum is disposed between the doped substrate and the aluminum or aluminum alloy interconnect level.

2. Description of the Prior Art

Integrated semiconductor component circuits are composed of multilayer structures formed of a great variety of materials. Contact must be provided between metal-metal, metal-insulator, semiconductor-insulator, and semiconductor-metal. In addition, structural defects such, for example, as grain boundaries and dislocations may exist in the layers. The close contact between the layers, the diverse nature of the materials, and the presence of structural defects are factors which provide problems at elevated temperatures and in the presence of external influences such as electrical voltages or high current densities. The interaction between the materials which sometimes occurs can seriously deteriorate the function of the circuit and reduce its reliability.

The problems become increasingly difficult with increased miniaturization where higher current densities occur, and the diffusion regions become flatter. Barrier layers must accordingly be introduced in VLSI (very large scale integrated) technology, to improve the reliability of the components at the contact surfaces by suppressing or reducing the surface reactions which can exist at those surfaces.

One of the critical boundary surface in components having structures measuring 1 micron or less are contacts between silicon and an aluminum alloy, for example, Al/Si, Al/Cu, Al/Si/Cu, or Al/Si/Ti. Since these contacts are exposed to temperatures up to 500° C. during manufacture of the components and the aluminum-silicon eutectic temperature is only about 577° C., an interdiffusion of the two materials into each other cannot be prevented to a depth of 100 nm or so. This effect is referred to as Al spiking and is described in the book "Thin Films Interdiffusion and Reactions", John Wiley and Sons, New York 1978, pages 15–25. The increasing current densities in the contacts additionally induce a silicon electromigration which leads to short circuits between the diffusion regions and the substrate. This effect cannot be eliminated by a silicon doping of the aluminum interconnect material.

Since the depth of the diffusion regions in the contact hole region only amounts to about 250 nm in VLSI components, there is the requirement that silicon diffusion into the aluminum, and aluminum diffusion into the silicon, can be tolerated only in the nm range.

The problem of obtaining a reliable contact between aluminum alloys and silicon has sometimes been resolved by separating the two materials from one another by means of a barrier layer. The functioning of such barrier layers is described in an article by P. S. Ho in "Thin Solid Films", Vol. 96 (1982), pages 301 to 316.

A barrier layer composed of a titanium-tungsten alloy is disclosed in an article by V. Hoffman in Solid State Technol., June, 1983, pages 119 to 126, and in an article by S. E. Babcock in J. Appl. Phys., Vol. 53 (10), October 1982, pages 6898 to 6905.

Further materials for barrier layers are disclosed in the following articles. A barrier layer of pure tungsten is described by D. L. Brors et al, in "Solid State Technol.", April 1984, pages 313 through 314. An article by C. Y. Ting et al in "Thin Solid Films", Vol. 96 (1982), pages 327 through 345, discloses a barrier layer of titanium nitride, as does an article by Wittmer in J. Vac. Sci. Technol. A2, Vol. 2 (1984), pages 273 through 279.

A disclosure of barrier layers of zirconium nitride will be found in Krusin-Elbaum et al "Thin Solid Films", Vol. 104 (1983), pages 81 through 87. A niobium-nickel alloy barrier layer is discussed by Wiley et al in IEEE Transactions of Industrial Electronics, Vol. 29 (1982), pages 154 through 157. Barrier layers of an iron-tungsten alloy are disclosed by Suni et al in "Thin Solid Films", Vol. 107 (1983), pages 73 through 80.

The materials mentioned above provide a low impedance contact to n+silicon when a clean boundary surface, i.e., a boundary surface free of oxides and carbonaceous impurities is present. The disadvantage of the aforementioned materials, however, is that a reactive element, referred to as a silicide-forming agent, is necessary for the reliable manufacture of a low impedance contact as described in J. Vac. Sci. Technol. A1, Vol. 2 (1983), pages 459 through 462. This can lead to a diffusion of silicon out of the contact hole at elevated temperatures, even as low as 450° C.

An article by Fraser et al in J. Vac. Sci. Technol., Vol. 18 (1981), pages 345 through 348, sets forth that very low impedance contacts can be obtained by employing tantalum silicide in combination with polycrystalline silicon as a gate contacting material. When other materials are to be utilized therein as diffusion barriers, as outlined above, this means an increased manufacturing expense.

SUMMARY OF THE INVENTION

The present invention provides an integrated semiconductor circuit comprising a high stability contact metallization is achieved using a tantalum silicide barrier layer in combination with layers of substantially pure tantalum. The three requirements necessary in the diffusion barrier, namely, a low impedance contact between aluminum and silicon, prevention of outward diffusion of silicon from the contact, and prevention of inward diffusion of aluminum are met. Furthermore, the manufacture of the contact metallization can be easily integrated into the manufacturing process for VLSI circuits.

In accordance with the present invention, we provide an integrated semiconductor circuit of the type generally set forth in European Patent Application No. 0 132 720 employing an intermediate tantalum silicide layer which acts as a barrier layer in both directions, i.e., toward the circuit element and toward the aluminum layer, the tantalum silicide layer being augmented on its top and bottom surfaces by means of a substantially pure tantalum layer.

In comparison with other tantalum silicide layers, the layer combination of the present invention has the advantage that in addition to preserving the electrical properties of the contact during heat treatment (for example, 450° C., 30 minutes in a hydrogen stream), no local defects such as voids are produced in the aluminum metallization layer as might be caused by a local diffusion of aluminum into the tantalum disilicide layer along the grain boundaries.

BRIEF DESCRIPTION OF THE DRAWINGS

The single FIGURE of the drawing is a greatly enlarged cross-sectional fragmentary view of an integrated circuit produced according to the present invention.

DESCRIPTION OF THE PREFERRED EMBODIMENTS

Referring to the single FIGURE in the drawing, reference numeral 1 refers to a silicon substrate in which there is provided an n+ or p+ doped flat region 2 constituting an impurity doped circuit element. The silicon substrate 1 is covered by a silicon dioxide layer 8 over its entire surface except for the area immediately above the circuit element 2, where the layer 8 is provided with a contact hole for providing electrical contact to the circuit.

Immediately above the silicon dioxide layer 8 and constituting the outer layer disposed within the contact hole there is a layer of substantially pure tantalum 5. This initial tantalum layer has a layer thickness of less than 5 nm adjacent the contact hole, and less than 2 nm within the contact hole. Preferably, the layer thickness of the initial tantalum layer 5 is from 1 to 2 nm and from 0.35 to 0.5 nm within the contact hole itself. Due to the high reactivity of the material, the impurities on the silicon which may consist of oxides or carbon are dissolved and a good ohmic contact is initially obtained. The low layer thickness of the initial tantalum layer 5 results in no noticeable outward diffusion of silicon from the circuit element 2, which might result in the formation of tantalum disilicide.

In order to prevent silicon from diffusing out over a longer period of time and at higher temperatures, a tantalum-silicon alloy layer 4 is applied over the thin tantalum layer 5 to provide a diffusion barrier. This layer 4 has a layer thickness of less than 200 nm and a thickness of about 30 nm in the contact hole. It may consist of from 30 to 36 mol percent tantalum, preferably 33 to 35 mole percent tantalum. The preferred layer thickness of the layer 4 is about 90 nm. The thickness of the layer 4 should not exceed about 200 nm since migrations from the substrate materials would otherwise occur as a consequence of internal stresses in the layer 4.

The layer of tantalum, by reacting with aluminum to form compounds such as $TaAl_3$ prevents the further penetration of aluminum. Consequently, a tantalum cover layer is provided as the upper layer 6 at a layer thickness of about 10 to 100 nm and a thickness of from 3 to 35 nm in the contact hole. The layer thickness is preferably on the order of 60 nm.

Finally, a doped aluminum layer 3 at a layer thickness of from 500 to 2000 nm can be vapor deposited or sputtered onto the combination of layers 5, 4, and 6 to form the connection site for external circuits.

The various layers of the present invention can be produced with known methods of semiconductor technology. For example, to produce the tantalum-silicon layer, co-sputtering can be employed, utilizing a silicon target or a sintering target with an appropriate composition which is atomized in addition to the tantalum target. It is also possible to secure the desired silicide by co-evaporation, or by means of chemical vapor deposition using a tantalum halide-hydrosilicon mixture. The tantalum layer as well as the tantalum-silicon layer can be produced by deposition from the vapor phase.

It will be understood that various modifications can be made to the described embodiments without departing from the scope of the present invention.

We claim as our invention:

1. An integrated semiconductor circuit comprising:
   a silicon substrate having an impurity doped circuit therein,
   a layer of silicon dioxide formed on said substrate and having a contact hole therein overlying said circuit,
   an outer contact interconnect layer composed of aluminum or an aluminum alloy for providing electrical contact to said circuit,
   a tantalum disilicide diffusion barrier layer disposed between said circuit and said interconnect layer, and
   a layer of substantially pure tantalum both above and below said tantalum disilicide diffusion barrier layer.

2. An integrated semiconductor circuit according to claim 1 wherein the lower tantalum layer touches said circuit and has a layer thickness of less than 5 nm and less than 2 nm in said contact hole.

3. An integrated semiconductor circuit according to claim 2 wherein the upper tantalum layer has a layer thickness of less than 150 nm and less than 50 nm in said contact hole.

4. An integrated semiconductor circuit according to claim 1 wherein said lower tantalum layer has a layer thickness of 1 to 2 nm and a thickness of 0.3 to 0.5 nm in said contact hole.

5. An integrated semiconductor circuit according to claim 4 wherein said tantalum disilicide diffusion barrier layer has a layer thickness of less than 200 nm, and a thickness of about 30 nm in said contact hole.

6. An integrated circuit according to claim 4 wherein said upper tantalum layer has a layer thickness of 10 to 100 nm and a thickness of from 3 to 35 nm in said contact hole.

7. An integrated circuit according to claim 1 wherein said tantalum disilicide layer has a tantalum content of from 30 to 36 mol percent.

8. An integrated circuit according to claim 7 wherein said tantalum disilicide layer has a tantalum content of from 33 to 35 mol percent.

9. An integrated circuit according to claim 1 wherein said tantalum disilicide layer and both said tantalum layers are produced by cathode sputtering.

10. An integrated circuit according to claim 1 wherein said tantalum disilicide layer and both said tantalum layers are produced by deposition from the vapor phase.

* * * * *